(12) United States Patent
Iwata et al.

(10) Patent No.: US 7,613,030 B2
(45) Date of Patent: Nov. 3, 2009

(54) SEMICONDUCTOR MEMORY DEVICE AND METHOD FOR OPERATING THE SAME

(75) Inventors: Syusuke Iwata, Kobe (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/561,632

(22) Filed: Nov. 20, 2006

(65) Prior Publication Data

US 2007/0121372 A1    May 31, 2007

(30) Foreign Application Priority Data

Nov. 25, 2005    (JP) ............................. 2005-341104

(51) Int. Cl.
*G11C 11/00*    (2006.01)

(52) U.S. Cl. ................. 365/154; 365/156; 365/181; 365/185.23

(58) Field of Classification Search ............. 365/154, 365/156, 185.23, 181; 354/698, 55
See application file for complete search history.

(56) References Cited

U.S. PATENT DOCUMENTS

| | | | | |
|---|---|---|---|---|
| 4,112,506 A | * | 9/1978 | Zibu ............................ | 365/181 |
| 4,441,169 A | * | 4/1984 | Sasaki et al. ................ | 365/190 |
| 4,779,231 A | | 10/1988 | Holzapfel et al. | |
| 4,933,899 A | * | 6/1990 | Gibbs ......................... | 365/177 |
| 5,036,487 A | | 7/1991 | Karetsos et al. | |
| 5,353,251 A | | 10/1994 | Uratani et al. | |
| 5,898,619 A | * | 4/1999 | Chang et al. ............ | 365/185.23 |
| 5,949,706 A | | 9/1999 | Chang et al. | |
| 5,987,534 A | * | 11/1999 | Shibayama .................. | 710/14 |
| 6,515,511 B2 | * | 2/2003 | Sugibayashi et al. .......... | 326/41 |

(Continued)

FOREIGN PATENT DOCUMENTS

EP    0365445    4/1990

(Continued)

OTHER PUBLICATIONS

Hiroki Dembo at al., RFCPUs on Glass and Plastic Substrates fabricated by TFT Transfer Technology, IEDM 05, pp. 1067-1069.

(Continued)

*Primary Examiner*—Hoai V Ho
*Assistant Examiner*—Fernando N Hidalgo
(74) *Attorney, Agent, or Firm*—Fish & Richardson P.C.

(57) ABSTRACT

A semiconductor memory device is provided, which comprises an analog switch, a first inverter, a second inverter, and a clocked inverter. A first terminal of the analog switch is electrically connected to a first data line. A second terminal of the analog switch is electrically connected to an input terminal of the first inverter, an output terminal of the second inverter, and an input terminal of the clocked inverter. An output terminal of the first inverter is electrically connected to an input terminal of the second inverter. An output terminal of the clocked inverter is electrically connected to a second data line. Each of the analog switch and the clocked inverter is electrically connected to at least one word line. The word line electrically connected to the analog switch is different from the word line electrically connected to the clocked inverter.

18 Claims, 14 Drawing Sheets

U.S. PATENT DOCUMENTS

| | | | |
|---|---|---|---|
| 6,683,602 B1 * | 1/2004 | Hioki | 345/204 |
| 6,775,180 B2 * | 8/2004 | Biyani et al. | 365/154 |
| 7,088,607 B2 | 8/2006 | Matsuzawa et al. | |
| 7,099,189 B1 * | 8/2006 | Plants | 365/154 |
| 2003/0076282 A1 | 4/2003 | Ikeda et al. | |
| 2003/0098875 A1 | 5/2003 | Kurokawa et al. | |
| 2004/0120209 A1 * | 6/2004 | Lee et al. | 365/230.05 |
| 2005/0213415 A1 | 9/2005 | Matsuzawa et al. | |
| 2006/0261946 A1 * | 11/2006 | Himberger et al. | 340/572.1 |

FOREIGN PATENT DOCUMENTS

| | | |
|---|---|---|
| JP | 08-161890 | 6/1996 |
| JP | 2005-276277 | 10/2005 |
| WO | WO 88/09037 | 11/1988 |

OTHER PUBLICATIONS

European Search Report, Application Serial No. 06023745.0, dated Dec. 20, 2007, 10 pages.

E.J. Nowak et al., "A Functional FinFET-DGCMOS SRAM Cell," IEDM 2002: Techinical Digest of International Electron Devices Meeting, 2002, pp. 411-414.

Jae-Hong Park et al., "A Study on the Fabrication of a Multigate/ Multichannel Polysilicon Thin Film Transistor," Japanese Journal of Applied Physics, vol. 36, Part 1, No. 3B, Mar. 1997, pp. 1428-1432.

European Office Action issued in European Patent Application No. 06 023 745.0-1233 dated Jan. 27, 2009.

* cited by examiner

600

650

SEMICONDUCTOR MEMORY DEVICE AND METHOD FOR OPERATING THE SAME

BACKGROUND OF THE INVENTION

1. Field of the Invention

The present invention relates to a semiconductor device (a semiconductor memory device) having a function of a memory. The present invention relates to a method for operating the semiconductor device.

2. Description of the Related Art

As processing of an LSI (Large Scale Integrated Circuit) becomes complicated, capacitance of a memory device (a memory) which is inside of an LSI has been increased. In particular, capacitance of a cache memory or the like which is incorporated into a CPU (Central Processing Unit) is greatly increased. A cache memory is a memory for storing frequently-used data in order to accelerate processing speed, and necessary capacitance of the cache memory becomes large as processing capability of a CPU is improved. Accordingly, the ratio whose a cache memory takes up in the whole area of an LSI becomes greatly high. Since the cache memory has a large area, influence on yield of a chip in the whole LSI, power consumption, and the like has also been increased.

FIG. 5 shows a conventional memory cell. An inverter loop 108 includes two N-channel transistors 111 and 113, and two P-channel transistors 112 and 114. An input terminal 104 of the memory cell is a power supply line, and an input terminal 105 is a ground line. A power voltage is supplied to the memory cell thorough the power supply line and the ground line.

Gate terminals of N-channel transistors 106 and 107 are connected to an input terminal 103 of the memory cell. Drain terminals of the N-channel transistors 106 and 107 are connected to input terminals 101 and 102 of the memory cell respectively. Source terminals of the N-channel transistors 106 and 107 are connected to nodes 109 and 110 of the inverter loop 108 respectively.

In the case of writing a value (also referred to as data) into the memory cell in FIG. 5, the input terminal 103 which is a word line for writing is held at a HIGH state to turn on the N-channel transistors 106 and 107. At this time, a value to be written is held in the input terminal 101, and an inverted value of which is written is held in the input terminal 102, so that the value is written into the memory cell.

When a value is read from the memory cell in FIG. 5, the input terminal 103 is held at a HIGH state to turn on the N-channel transistors 106 and 107. At this time, the input terminals 101 and 102 are held at a potential between a HIGH state and a LOW state (hereinafter described as an intermediate potential) to read the value from the memory cell, and the potential difference is amplified in a reading circuit so that the value is read.

A memory cell which employs six transistors can form an SRAM (Static Random Access Memory). In the case of manufacturing an SRAM in this manner, it is necessary that a value of the memory cell is not rewritten by a current from the input terminals 101 and 102. Specifically, when the N-channel transistors 106 and 107 are turned on at the time of reading, it is necessary that a value of the memory cell is not rewritten by a current from the input terminals 101 and 102 which are held at intermediate potentials.

However, if variation in the threshold voltage or the like of transistors is large, a value of the memory cell is rewritten at the time of reading. An RF circuit is sensitive to the threshold voltage of the transistor, and in particular, a malfunction due to variation in the threshold voltage of the transistors is generated in the case of employing thin film transistors as the transistors.

Description will be made below of the case where a value of the memory cell is rewritten at the time of reading when variation in the threshold voltage of the transistors is large with reference to FIG. 5, using a power supply voltage of 5 V.

The input terminals 101 and 102 are held at the intermediate potentials at the time of reading. A potential in the inverter loop 108 is determined by a current flowing into the memory cell through the N-channel transistors 106 and 107 which are turned on and a current supplied from the transistors which are in the inverter loop 108 in the memory cell.

When variation in the threshold voltage of these transistors is within the scope of the assumption at the time of designing, miswriting of a value of the memory cell does not occur at the time of reading. Description will be made of the case where, for example, the threshold voltage of the N-channel transistor 113 is relatively high, and the threshold voltage of the P-channel transistor 112 is relatively low. In addition, the N-channel transistors 106 and 107 are turned on, that is, the input terminals are turned on when the node 109 is held at 5 V and the node 110 is held at 0 V.

When the N-channel transistors 106 and 107 are turned on, a current flows from the input terminal 101 into the memory cell through the N-channel transistor 106. At this time, the potential of the node 109 becomes lower than the power supply voltage of 5 V and a little bit higher than the intermediate potential of 2.5 V for an instance by a current flowing from the power supply to the node 109 through the P-channel transistor 112 which is turned on. Accordingly, the voltage of the node 110 which is an output of an inverter formed of the N-channel transistor 113 and the P-channel transistor 114 becomes higher than 0 V.

At this time, since the threshold voltage of the N-channel transistor 113 is high and the value of a current which flows to the N-channel transistor 113 at the potential a little bit higher than the intermediate potential decreases, a current from the P-channel transistor 114 increases so that the voltage of the node 110 is rewritten to be 5 V.

As described above, when the characteristic variation in the transistors is large, a configuration of six transistors as shown in FIG. 5 is not suitable for an SRAM. Therefore, a port for writing and a port for reading are separated from each other so that a wrong value cannot be written at the time of reading. For example, by employing a configuration which is disclosed in Reference 1 (Reference 1: Japanese Published Patent Application No. 08-161890) where a port for writing and a port for reading are separated from each other, a wrong value cannot be written at the time of reading. Note that the configuration where a port for writing and a port for reading are separated from each other can achieve, high integration of the memory cell, which is an object of Reference 1.

By separating a port for writing and a port for reading from each other with the configuration of the memory cell which is disclosed in Reference 1, there is no possibility that miswriting occurs at the time of reading. However, in the case of employing this configuration of the memory cell, a complicated circuit such as a precharge circuit is necessary for a reading circuit. It is to be noted that a precharge circuit is provided in a reading circuit and holds a data line for reading at a HIGH state in a period other than a reading period.

SUMMARY OF THE INVENTION

In view of the foregoing, it is an object of the invention to provide an SRAM which does not cause miswriting even if characteristics of transistors vary, and does not require a complicated reading circuit.

In view of the foregoing object, the invention provides a memory cell in which a port for writing and a port for reading of the memory cell are separated from each other, and does not require a complicated circuit such as a precharge circuit.

Hereinbelow, the invention will be specifically described.

One aspect of the invention is a semiconductor memory device including an analog switch, a first data line connected to an input terminal (also referred to as a first terminal, an input-output terminal) of the analog switch, a first inverter connected to an output terminal (also referred to as a second terminal, an input-output terminal) of the analog switch, a second inverter connected to an output terminal of the first inverter, a clocked inverter connected to an input terminal of the second inverter and the output terminal of the analog switch, and a second data line connected to an output terminal of the clocked inverter. Each of the analog switch and the clocked inverter is connected to a plurality of word lines.

Another aspect of the invention is a semiconductor memory device including an analog switch, a first data line connected to an input terminal of the analog switch, a first inverter connected to an output terminal of the analog switch, a second inverter connected to an output terminal of the first inverter, a clocked inverter connected to an input terminal of the second inverter and the output terminal of the analog switch, and a second data line connected to an output terminal of the clocked inverter. A first word line is connected to a gate of a first transistor included in the analog switch; a second word line is connected to a gate of a second transistor included in the analog switch; a third word line is connected to a gate of a third transistor included in the clocked inverter; and a fourth word line is connected to a gate of a fourth transistor included in the clocked inverter.

Another aspect of the invention is an operating method of a semiconductor memory device including an analog switch, a first data line connected to an input terminal of the analog switch, a first inverter connected to an output terminal of the analog switch, a second inverter connected to an output terminal of the first inverter, a clocked inverter connected to an input terminal of the second inverter and the output terminal of the analog switch, and a second data line connected to an output terminal of the clocked inverter. Each of the analog switch and the clocked inverter is connected to a plurality of word lines. One of the word lines connected to the analog switch is held at a HIGH state, and the other word lines are held at a LOW state so that a value based on data input by the first data line is written; and one of the word lines connected to the clocked inverter is held at a HIGH state, and the other word lines are held at a LOW state so that the written value is read by the second data line.

Another aspect of the invention is an operating method of a semiconductor memory device including an analog switch, a first data line connected to an input terminal of the analog switch, a first inverter connected to an output terminal of the analog switch, a second inverter connected to an output terminal of the first inverter, a clocked inverter connected to an input terminal of the second inverter and the output terminal of the analog switch, and a second data line connected to an output terminal of the clocked inverter. A first word line is connected to a gate of a first transistor included in the analog switch; a second word line is connected to a gate of a second transistor included in the analog switch; a third word line is connected to a gate of a third transistor included in the clocked inverter; and a fourth word line is connected to a gate of a fourth transistor included in the clocked inverter. The first word line is at a HIGH state and the second word line is at a LOW state so that a value based on data input by the first data line is written; and the third word line is set at a HIGH state and the fourth word line is set at a LOW state so that the written value is read by the second data line.

In the semiconductor memory device of the invention, the analog switch includes an N-channel transistor and a P-channel transistor. In addition, in the semiconductor memory device of the invention, the clocked inverter includes a plurality of N-channel transistors and a plurality of P-channel transistors.

Another aspect of the invention is an operating method of a semiconductor memory device including a memory cell. The memory cell has the analog switch, the first inverter, the second inverter, and the clocked inverter. The analog switch turns on, the clocked inverter turns off, and data is written to the memory cell. The analog switch turns off, the clocked inverter turns on, and the data is read from the memory cell.

By employing the semiconductor memory device of the invention and the operating method thereof, writing and reading can be surely performed even if characteristics of transistors vary.

BRIEF DESCRIPTION OF THE DRAWINGS

In the accompanying drawings.

DETAILED DESCRIPTION OF THE INVENTION

Figure 1:
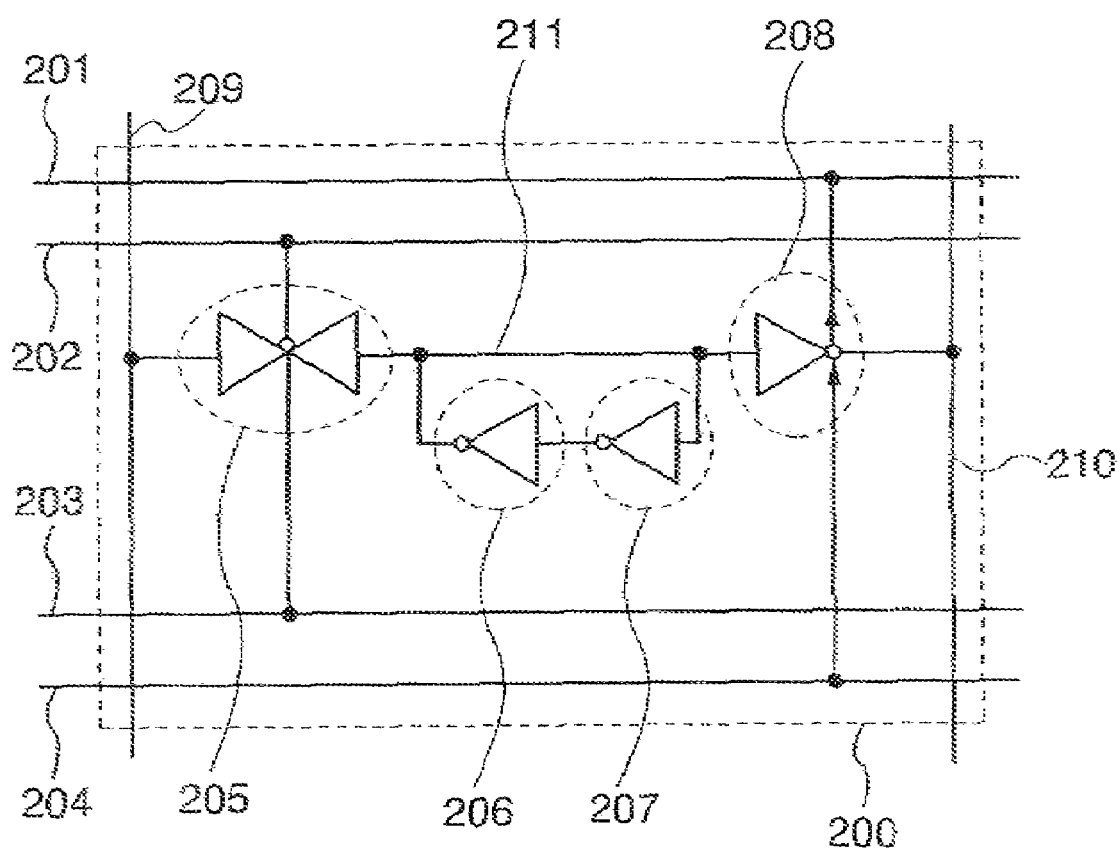
FIG. 1 is a diagram showing a configuration of a memory cell of the invention.

Although the invention will be fully described by way of embodiment modes and an embodiment with reference to the drawings, it is to be understood that various changes and modifications will be apparent to those skilled in the art. Therefore, unless such changes and modifications depart from the scope of the invention, they should be construed as being included therein. Therefore, the invention is not limited to the following description. Note that the same portions or portions having the same functions are denoted by the same reference numerals, and repetitive description is omitted.

Embodiment Mode 1

FIG. 1 shows a circuit diagram of a memory cell of an SRAM of the invention. In FIG. 1, a memory cell 200 includes an analog switch 205, a double-gate inverter 206, an inverter 207, and a clocked inverter 208. Since the double-gate inverter 206 has low supply capability of current, a value can be surely written at the time of writing. Note that, although description is made employing a double-gate inverter in this embodiment mode, a single-gate inverter may be employed as well.

It is to be noted that the double-gate inverter has a double-gate N-channel transistor and a double-gate P-channel transistor. A double-gate transistor has two gates and two channel forming regions. A channel length of the double-gate transistor is long since the double-gate transistor has two channel forming regions, and the double-gate transistor has low supply of capability of current because the channel length of the double-gate transistor is long. It is to be noted that a channel width of a transistor is designed to be short in order to have low supply of capability of current.

Figure 13A:
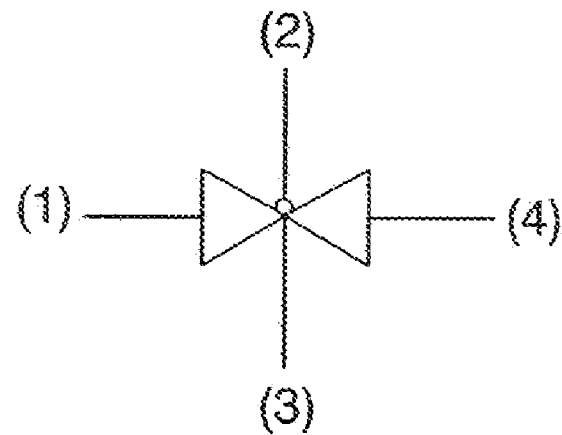
FIG. 13A and 13B are diagrams showing an analog switch of a memory cell of the invention.
Figure 13B:
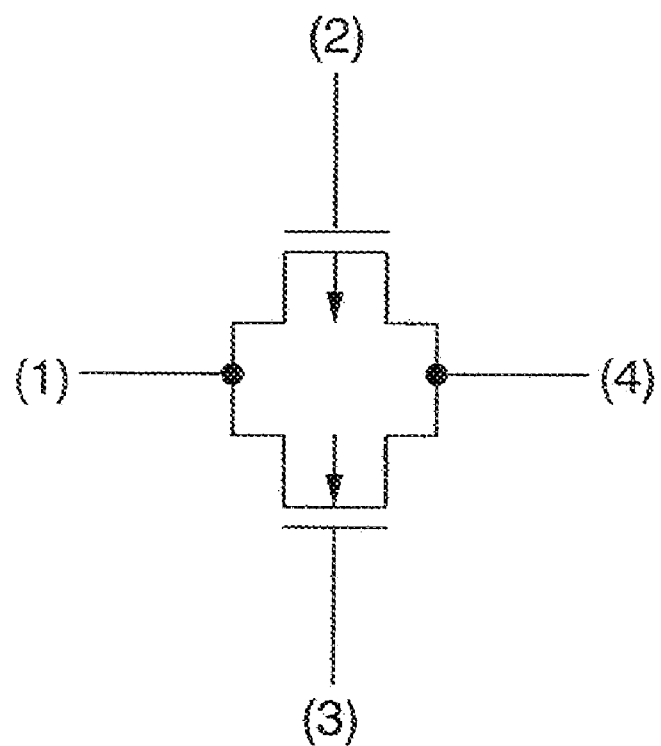

An input terminal of the analog switch 205 is connected to an input wire 209, and an output terminal of the analog switch 205 is connected to a wire (hereinafter described as an internal node) 211. The analog switch 205 has an N-channel transistor and a P-channel transistor as shown in FIGS. 13A and 13B. Respective ones of electrodes of the N-channel transistor and the P-channel transistor are connected to each other, or the respective others of the electrodes are connected to each other. FIG. 13A shows a circuit symbol of the analog switch 205 having terminals (1) to (4), and FIG. 13B is a circuit diagram corresponding to FIG. 13A. A gate of the N-channel transistor included in such an analog switch is connected to an input wire 203, and a gate of the P-channel transistor included in such an analog switch is connected to an input wire 202.

Figure 14A:
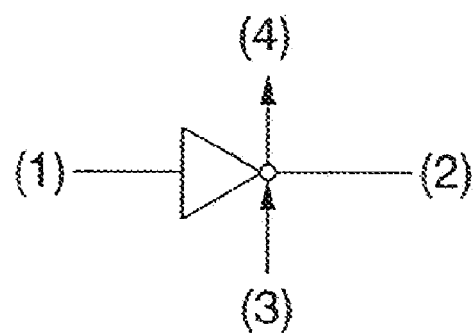
FIG. 14A and 14B are diagrams showing a clocked inverter of a memory cell of the invention.
Figure 14B:
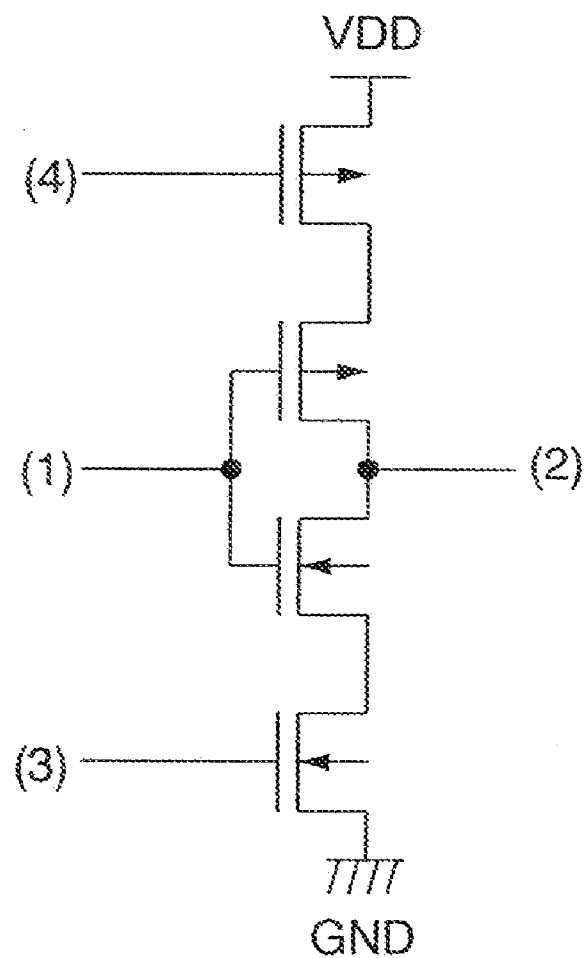

An input terminal of the clocked inverter 208 is connected the internal node 211, and an output terminal of the clocked inverter 208 is connected to an output wire 210 of the memory cell 200. The clocked inverter 208 has a plurality of N-channel transistors and a plurality of P-channel transistors as shown in FIGS. 14A and 14B, and these transistors are sequentially connected in series. FIG. 14A shows a circuit symbol of the clocked inverter 208 having terminals (1) to (4), and FIG. 14B is a circuit diagram corresponding to FIG. 14A. An input terminal of N-channel switch included in the clocked inverter 208, that is, the N-channel transistor is connected to an input wire 204 of the memory cell 200. An input terminal of P-channel switch included in the clocked inverter 208, that is, the P-channel transistor is connected to an input wire 201 of the memory cell 200.

An input terminal of the inverter 207 is connected to the internal node 211, and an output terminal of the inverter 207 is connected to an input terminal of the double-gate inverter 206. An output terminal of the double-gate inverter 206 is connected to the internal node 211.

Description will be made of the case where a value is written into the memory cell 200 of this embodiment mode below. The input wires 203 and 202 are word lines for writing, to which a decoder is connected. The input wire 203 is held at a HIGH state, and the input wire 202 is held at a LOW state at the time of writing The input wire 203 is held at a LOW state, and the input wire 202 is held at a HIGH state at the time of other than writing. Note that a HIGH state corresponds to a state in which a relative voltage value is high, and a LOW state corresponds to a state in which a relative voltage value is low, and the HIGH state is denoted by 1, and the LOW state is denoted by 0. The input wire 209 is a data line for writing, and is held at a HIGH state in the case of writing 1, and it is held at a LOW state in the case of writing 0.

When the input wire 203 is held at a HIGH state, and the input wire 202 is held at a LOW state, the analog switch 205 is turned on. The potential of the internal node 211 of the memory cell 200 is determined by the amount of a current and a voltage from the input wire 209 and the amount of a current and a voltage from the double-gate inverter 206. When the voltage of the internal node 211 is higher than the threshold voltage of the inverter 207, an output potential of the inverter 207 is inverted, thereby a value which is output from the double-gate inverter 206 is also inverted so that a value of the memory cell 200 is rewritten. Such a signal after the potential is inverted is described as an inverted signal. In the memory cell 200 of this embodiment mode, the double-gate inverter is employed as an inverter 206. Since the double-gate inverter 206 has low supply capability of current, a value can be surely written at the time of writing. Signals are input from the input wires 202 and 203 to a circuit which is used at the time of writing in this manner.

Description will be made of the case where a value is read from the memory cell 200 of this embodiment mode below. The input wires 201 and 204 are word lines for reading, to which a decoder is connected. The input wires 201 and 204 are asserted by the decoder based on a WE (WRITE ENABLE) signal and an ADDR (ADDRESS, ADDR signal, ADDRESS signal) so as to set the input wire 204 at a HIGH state and the input wire 201 at a LOW state at the time of reading. The input wire 204 is held at a LOW state, and the input wire 201 is held at a HIGH state at the time other than reading. The output wire 210 is a data line for reading, and the clocked inverter 208 is turned on to output a value in which the potential of the internal node 211 is inverted, to the output wire 210 when the input wire 204 is asserted to be at a HIGH state and the input wire 201 is asserted to be at a LOW state. In this manner, the input wires 201 and 204 are employed as ports for reading.

In the configuration of the memory cell 200 of this embodiment mode, the potential of the internal node 211 is determined by the amount of a current of the double-gate inverter 206 and the writing circuit of a memory. However, if gate width of the writing circuit is sufficiently large, a value can surely be written even if the threshold voltage of the transistors vary.

Namely, if a gate width of a transistor included in the analog switch is sufficiently large, a value can surely be written to the memory cell even if the threshold voltages of the transistors vary. Also, if a gate width of a transistor included in the circuit which drives the input wire 209 is sufficiently large, a value can surely be written to the memory cell even if the threshold voltages of the transistors vary.

A port for writing and a port for reading of the memory cell are separated, that is, an input wire which is employed at the time of writing are different from an input wire which is employed at the time of reading. Therefore, electric charges which are held in the memory cell do not affect a port for holding a value of the memory cell at the time of reading so that there is no possibility that miswriting occurs at the time of reading. If an SRAM is manufactured by employing the memory cell of this embodiment mode, a complicated circuit is not required as the reading circuit since a value whose the memory cell holds is held at the time of reading.

Embodiment Mode 2

In the SRAM, when a value is written to a memory cell by setting the input wires 202 and 203 which are the word lines at a HIGH state and at a LOW state respectively, miswriting occurs if timing is not considered. Description will be made of timing where miswriting occurs with reference to FIG. 2.

Figure 2:
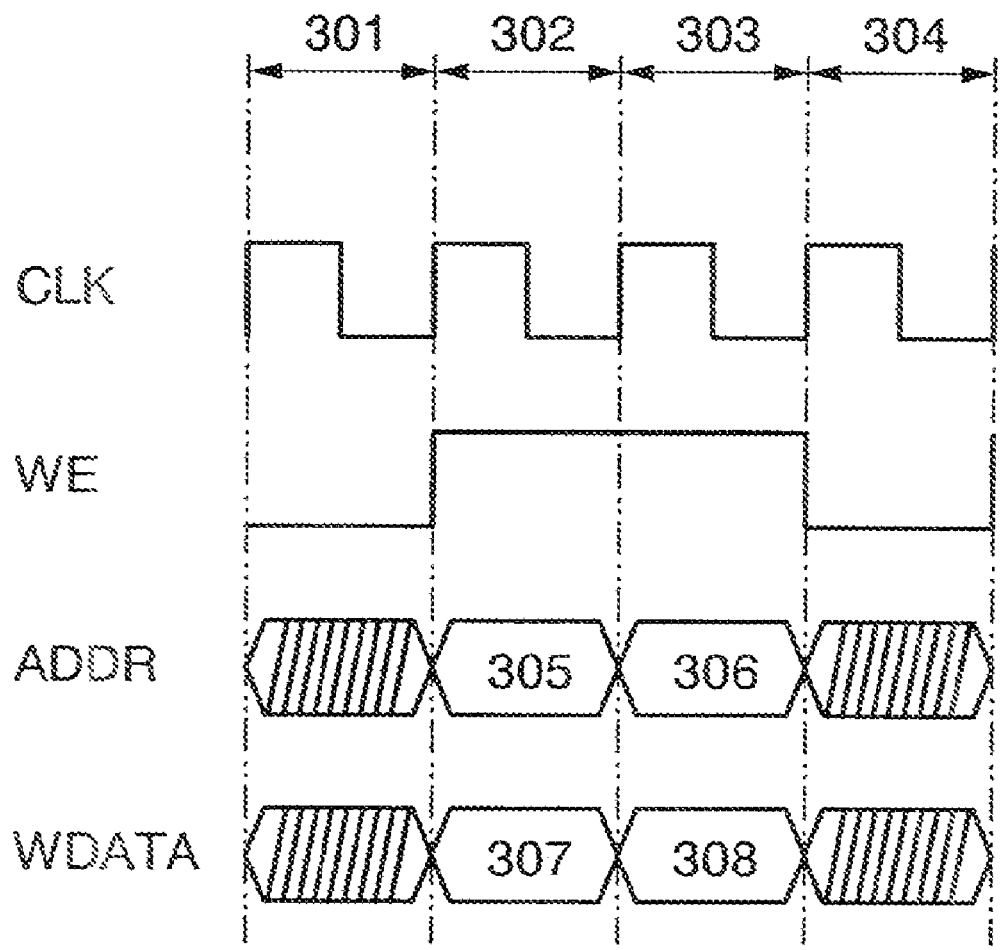
FIG. 2 is a timing chart of a general SRAM.

In FIG. 2, a CLK (CLOCK) signal is a clock signal. A WE (WRITE ENABLE) signal is a signal for specifying a period which a value is written to a memory cell, and a period in which this signal is at a HIGH state corresponds to the period which the value is written to the memory cell. An ADDR (ADDRESS) represents an address of a memory cell into which a value is written. A WDATA (WRITE DATA) represents a value which is written to a memory cell specified by the ADDR.

It is to be noted that a Read/Write circuit and a decoder is provided near a memory cell array, which has a plurality of memory cells. The CLK signal, the WE signal, and WDATA are inputted to the Read/Write circuit. The CLK signal and the ADDR are inputted to the decoder. The Read/Write circuit is electrically connected to the input wire 209 and the output wire 210. The decoder is electrically connected to the input wires 201 to 204.

The RE signal and RDATA is inputted to the Read/Write circuit. RDATA is a value which is read from the memory cell 400.

In FIG. 2, writing a value to a memory cell is not performed in periods 301 and 304 since the WE signal is at a LOW state. A period 302 is a period where WDATA 307 is written into a memory cell of ADDR 305, and a period 303 is a period where WDATA 308 is written into a memory cell of ADDR 306. A problem may occur when the state of the SRAM transits from the period 302 to the period 303, that is, when the operation is switched from the period 302 to the period 303. At this state transition, the WE signal has continuously been at a HIGH state from the period 302 through the period 303.

If timing at which the value whose the ADDR bus is held changes from the ADDR 305 to the ADDR 306 is a little bit later than timing at which the WDATA changes from the WDATA 307 to the WDATA 308 because of variation in or threshold voltage of transistors, or the like, the value whose the ADDR bus is held changes from the WDATA 307 to the WDATA 308 since the WE signal has been held at a HIGH state. Normally, a value of the WDATA 307 is supposed to be written into a memory cell of the ADDR 305 and a value of the WDATA 308 is supposed to be written into a memory cell of the ADDR 306. However, the value of the WDATA 308 is written into the memory cell of the ADDR 305 and the memory cell of ADDR 306 in the above case. As described above, the SRAM may miswrite a value because of variation in or threshold voltage of the transistors, or the like when the WE signal is at a HIGH state.

Therefore, in the case of manufacturing an SRAM by using transistors with large variation in electric properties, such as TFTs, miswriting occurs if timing is not considered. Thus, in this embodiment mode, description will be made of timing which is considered not to cause miswriting with reference to FIG. 3. Similarly to FIG. 2, a CLK (CLOCK) signal is a clock signal. A WE (WRITE ENABLE) signal is a signal for specifying a period which a value is written to a memory cell, and a period in which this signal is at a HIGH state corresponds to the period which the value is written to the memory cell. An ADDR (ADDRESS) represents an address of a memory cell into which a value is written. A WDATA (WRITE DATA) represents a value which is written to a memory cell specified by the ADDR.

In periods 401, 403, 404, and 406, the WE signal is at a LOW state. A WE signal of a memory cell of an ADDR 407 is at a HIGH state since the WE signal is at a HIGH state in a period 402, so that a value 409 is written into a memory cell of the ADDR 407. A WE signal of a memory cell of an ADDR 408 is at a HIGH state since the WE signal is also at a HIGH state in a period 405, so that a value 410 is written into a memory cell of the ADDR 408.

Figure 3:
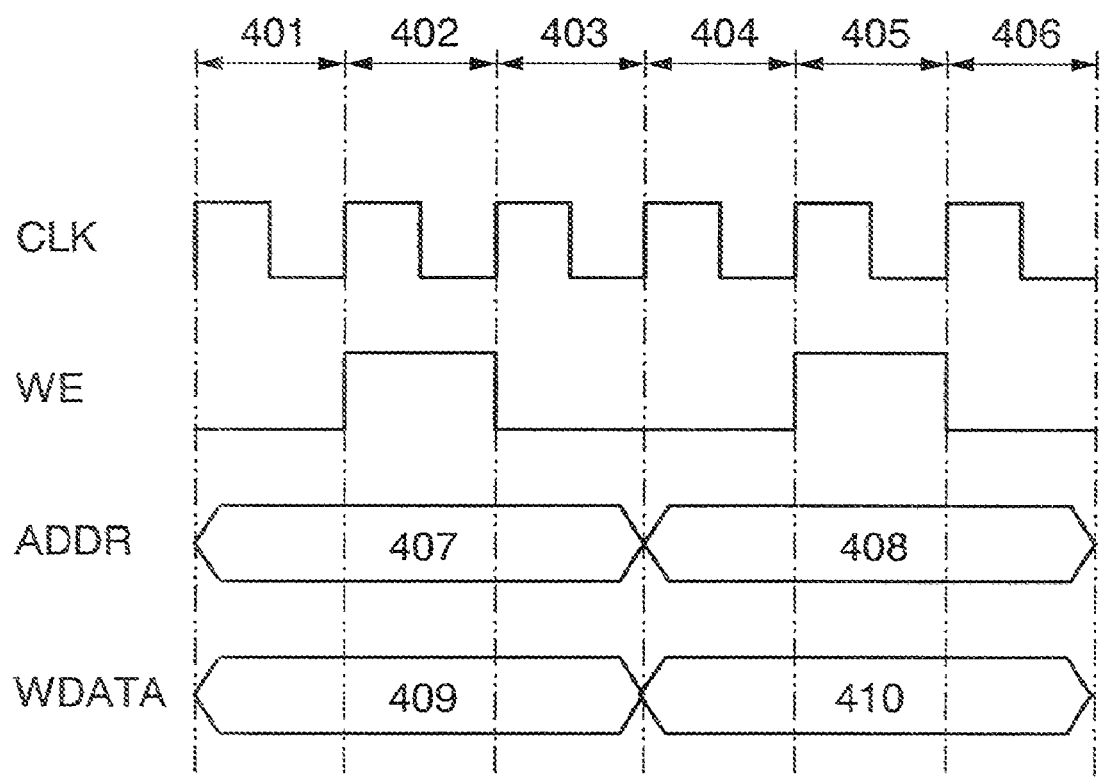
FIG. 3 is a first timing chart of an SRAM of the invention.

When the SRAM is driven at the timing shown in FIG. 3, the WE signal becomes a HIGH state when the operation is switched from the period 401 to the period 402, so that the WE signal of the memory cell of the ADDR 407 becomes a HIGH state. The WE signal becomes in a LOW state at timing at which the value 409 is written into a memory cell of the ADDR 407 in the period 402, and the operation is switched from the period 402 to the period 403. In this manner, when the WE signal is held at a HIGH state at timing within a range of not changing the ADDR and the WDATA, miswriting does not occur.

Operation can be performed with one system of clock in the operating method described in this embodiment mode. Therefore, in order to wait for changing the ADDR and the WDATA, the WE signal needs the respective times each for 1 clock before and after 1-clock periods of a HIGH state, that is, the WE signal needs times for 3 clocks in total.

As described above, in the memory cell of the invention, a port for writing and a port for reading are separated from each; and besides, when the WE signal is held at a HIGH state at timing within a range of not changing the ADDR and the WDATA, thereby miswriting does not occur.

Embodiment Mode 3

Figure 4:
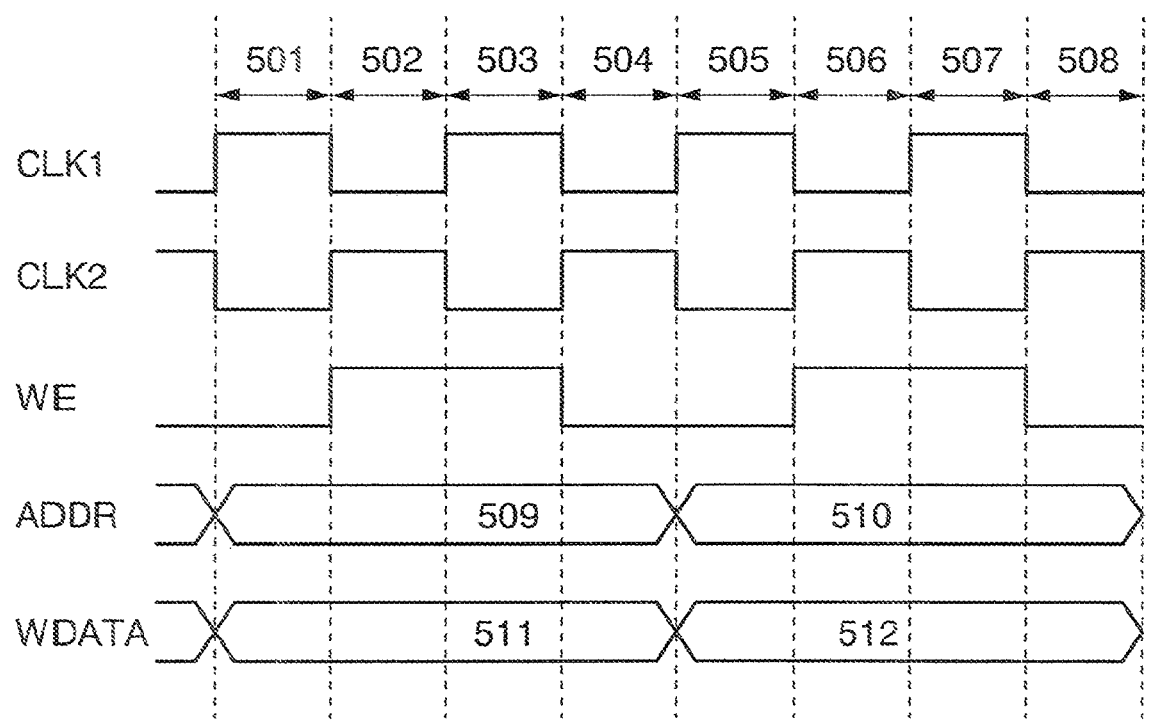
FIG. 4 is a second timing chart of an SRAM of the invention.
Figure 5:
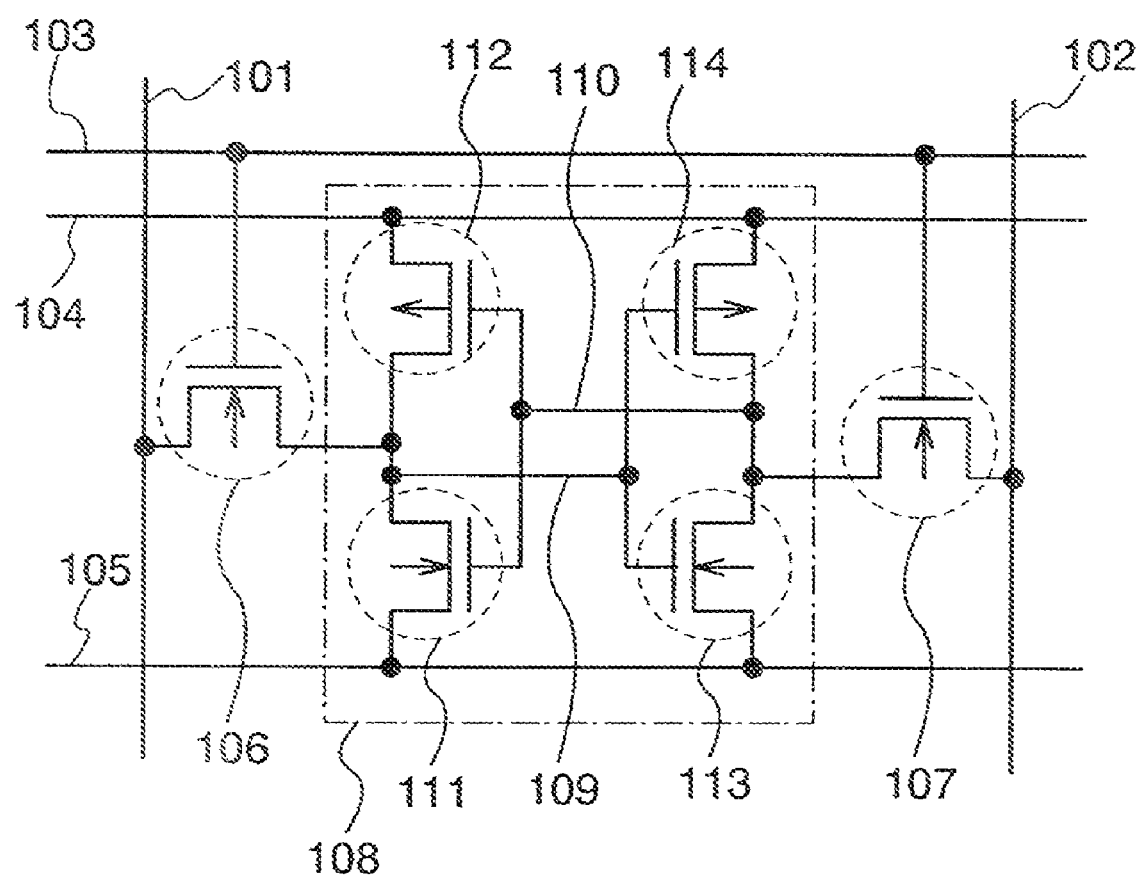
FIG. 5 is a configuration diagram of a memory cell of general SRAM.

In this embodiment mode, Description will be made of a driving method so as not to cause miswriting by employing a positive clock and a negative clock unlike the aforementioned embodiment mode, with reference to FIG. 4.

CLK1 and CLK2 are clock signals, and they have a relation where a HIGH state and a LOW state are inverted to each other. By utilizing this relation, the WE signal can perform writing without causing miswriting at the respective times each for half clock before and after a 1-clock period of a HIGH state, that is, at the time for 2 clocks in total. Specifically, the ADDR and the WDATA are driven with a positive edge of the CLK1, and the WE signal is driven with a positive edge of the CLK2.

Description will be made of an operation of writing at timing of driving of this embodiment mode below. The ADDR and the WDATA change at timing of the positive edge of the CLK1 which switches into an operation of a period 501. After this, the ADDR and the WDATA are kept constant in the period 501 to a period 504. The WE signal changes to be a HIGH state at timing of the positive edge of the CLK2 which switches the operation from the period 501 to the period 502, so that a writing signal of a memory cell of an ADDR 509 becomes a HIGH state. A value of the memory cell of the ADDR 509 is rewritten between the period 502 and the period 503, so that the writing signal of the memory cell of the ADDR 509 becomes a LOW state at timing of the positive edge of the CLK2 which switches the operation from the period 503 to the period 504. At this time, since a word line of the ADDR 509 is controlled by the ADDR bus and the WE signal, the word line of the ADDR 509 changes similarly to the change of the WE signal since the WE signal changes without changing the ADDR 509.

Next, the ADDR and the WDATA change at timing of the positive edge of the CLK1 which switches the operation from the period 504 to a period 505. After this, the respective addresses into which the ADDR and the WDATA are written and the respective values are held in the period 505 to a period 508. The WE signal chnges to be a HIGH state at timing of the positive edge of the CLK2 which switches the operation from the period 505 to the period 506, so that a writing signal of a memory cell of an ADDR 510 becomes at a HIGH state. A value of the memory cell of the ADDR 510 is rewritten between the period 506 and the period 507, so that a writing signal of the memory cell of the ADDR 510 becomes a LOW state at timing of the positive edge of the CLK2 which switches the operation from the period 507 to the period 508.

In this manner, miswriting does not occur when the WE signal is held at a HIGH state at the timing within the range of not changing the ADDR and the WDATA similarly to Embodiment Mode 3, and writing can be performed than in shorter time than the case of using one system of clock, by using two system of clocks which have an inverted relation.

Embodiment Mode 4

In this embodiment mode, Description will be made of a manufacturing method of a radio chip (also referred to as a wireless chip) having the memory cell of the invention.

Figure 6A:
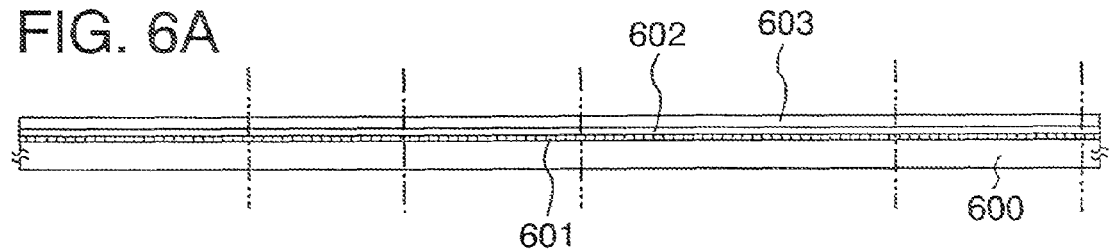
FIGS. 6A to 6D are diagrams showing a manufacturing process of a radio chip of the invention.

In FIG. 6A, over a substrate having an insulating surface (hereinafter described as insulating substrate) 600, a release layer 601, an insulating layer 602, and a semiconductor film 603 are formed in this order. As the insulating substrate 600, a glass substrate, a quartz substrate, a substrate which is made of silicon, a metal substrate, a plastic substrate, or the like can be employed. In addition, the insulating substrate 600 may be thinned by polishing. By employing the insulating substrate which is thinned, a finished product can be reduced in weight and thickness.

The release layer 601 can be formed of an element selected from tungsten (W), titanium (Ti), tantalum (Ta), molybdenum (Mo), niobium (Nb), neodymium (Nd), nickel (Ni), cobalt (Co), zirconium (Zr), zinc (Zn), ruthenium (Ru), rhodium (Rh), palladium (Pd), osmium (Os), iridium (Ir), and silicon (Si), an alloy material which includes any of these elements as a main component, or a compound material which includes any of these elements as a main component. The release layer 601 can have either a single-layer structure of the aforementioned elements or the like or a stacked-layer structure of the aforementioned elements or the like. Such a release layer can be formed by CVD, sputtering, an electron beam, or the like. In this embodiment mode, tungsten (W) is formed by CVD. At this time, plasma treatment may be performed by using $O_2$, $N_2$, or $N_2O$; thereby, a separation step which is a later step can easily be performed. In addition, the release layer 601 is not required to be formed over the whole insulating substrate 600, and may be formed selectively. That is, a region in which the release layer 601 is formed is not particularly limited as long as the insulating substrate 600 can be separated.

An inorganic material such as silicon oxide or silicon nitride can be employed as the insulating layer 602. By employing silicon nitride, invasion of impurities from the insulating substrate 600 can be prevented. In addition, the insulating layer 602 can have either a single-layer structure or a stacked-layer structure. When the insulating layer 602 has a stacked-layer structure, such silicon nitride exhibits an advantageous effect by employing it as any one of layers.

A material having silicon can be employed as the semiconductor film 603. The semiconductor film 603 can be formed by CVD or sputtering. A crystal structure of the semiconductor film 603 may be any of an amorphous structure, a crystalline structure, and a micro-crystalline structure. Mobility of a thin film transistor can be increased as crystallinity of the semiconductor film 603 increases, which is preferable. By employing a microcrystalline or amorphous structure, there is no variation in crystalline state between semiconductor films which are adjacent to each other, which is preferable.

In order to form a crystalline semiconductor film, there is a case where the crystalline semiconductor film is formed directly over the insulating layer 602; however, in this embodiment mode, the crystalline semiconductor film is manufactured by heating an amorphous semiconductor film formed over the insulating layer 602. For example, heat treatment is performed to the amorphous semiconductor film by heating furnace or laser irradiation. Accordingly, a semiconductor film having high crystallinity can be formed. At this time, in order to lower the heating temperature, a metal element which promotes crystallization may be employed. For example, nickel (Ni) may be added into a surface of the amorphous semiconductor film and heat treatment may be performed, so that the heating temperature can be lowered. Accordingly, a crystalline semiconductor film can be formed over an insulating substrate having low heat resistance. Note that in the case of employing laser irradiation, heat resistance of an insulating substrate which is employed is not limited since the semiconductor film can be heated selectively.

Figure 6B:
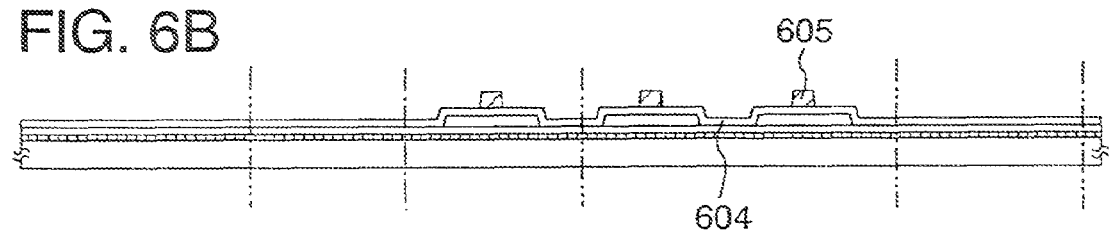

As shown in FIG. 6B, the semiconductor film 603 is processed to have a predetermined shape. Etching which uses a mask formed by photolithography can be employed for the processing. Either dry etching or wet etching can be employed as the etching.

An insulating layer which functions as a gate insulating film 604 is formed so as to cover the processed semiconductor film 603. The gate insulating film 604 can be formed by using an inorganic material; for example, silicon nitride or silicon oxide can be used. Plasma treatment may be performed before or after forming the gate insulating film 604. Oxygen plasma or hydrogen plasma can be employed as the plasma treatment. By performing such plasma treatment, impurities of a surface on which the gate insulating film 604 is formed or a surface of the gate insulating film 604 can be removed.

After that, a conductive layer which functions as a gate electrode 605 is formed over the semiconductor film 603 with the gate insulating film 604 interposed therebetween. The gate electrode 605 can have either a single-layer structure or a stacked-layer structure. The gate electrode 605 can be formed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), copper (Cu), and indium (In), an alloy material which includes any of these elements as a main component, or a compound material which includes any of these elements as a main component.

Figure 6C:
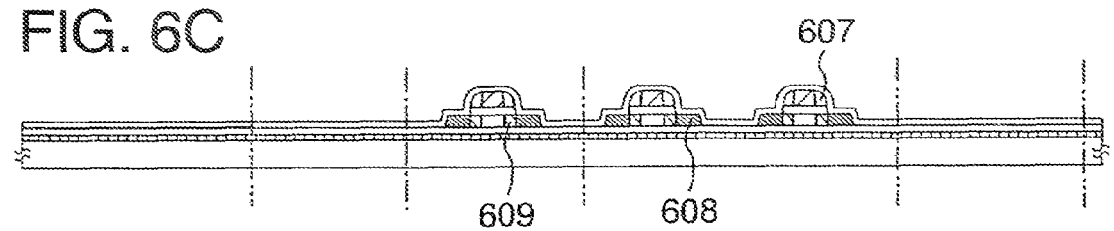

As shown in FIG. 6C, an insulator which functions as a sidewall 607 is formed on sides of the gate electrode 605. The sidewall 607 can be formed by using an inorganic material or an organic material. Silicon oxide and silicon nitride can be given as examples of the inorganic material. For example, silicon oxide is formed so as to cover the gate electrode 605 and isotropic etching is performed, the silicon oxide remains only on the sides of the gate electrode 605 which can be used as the sidewall 607. Either dry etching or wet etching can be employed as the isotropic etching. When the sidewall 607 is processed, the gate insulating film 604 is also etched away. Accordingly, a part of the semiconductor film 603 is exposed.

Employing the sidewall 607 and the gate electrode 605, the semiconductor film 603 is doped with impurity elements in a self-aligned manner. Accordingly, impurity regions having different concentration are formed in the semiconductor film 603. An impurity region 609 formed below the sidewall 607 has lower concentration than the concentration of an impurity 608 formed in the part of the semiconductor film 603 which is exposed. By varying the concentration of the impurity regions in this manner, a short-channel effect can be prevented.

Figure 6D:
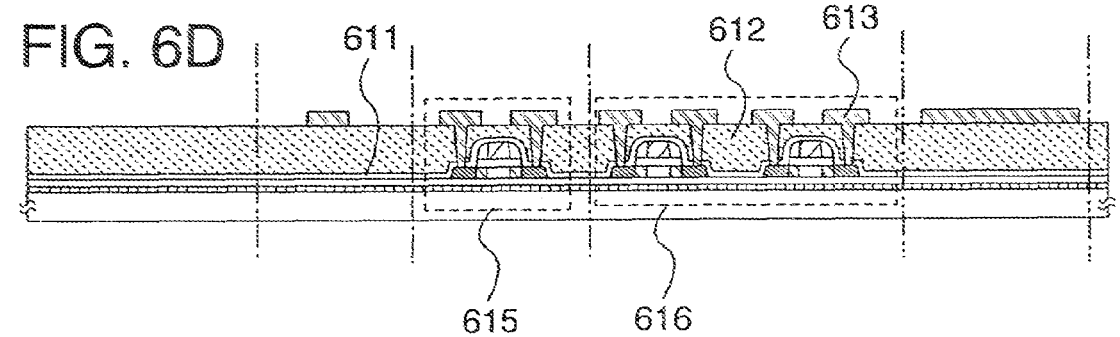

As shown in FIG. 6D, insulating layers 611 and 612 are formed to cover the semiconductor film 603, the gate electrode 605, and the like. The insulating layers 611 and 612 which cover the semiconductor film 603, the gate electrode 605, and the like may have single-layer structures; however, the insulating layers 611 and 612 are preferably have stacked-layer structures as described in this embodiment mode. This is because invasion of impurities can be prevented by forming the insulating layer 611 by using an inorganic material, and a dangling bond in the semiconductor film 603 can be terminated by using hydrogen in the insulating layer 611, by applying an inorganic material using CVD. After that, planarity can be improved by forming the insulating layer 612 by using an organic material. As the organic material, polyimide, acryl, polyamide, polyimide amide, resist, benzocyclobutene, siloxane, or polysilazane can be employed. Note that siloxane is formed with a skeletal structure where silicon (Si) and oxygen (O) are bonded to each other. As a substituent, an organic group which contains at least hydrogen (for example, alkyl group or aromatic hydrocarbon) is employed. As a substituent, fluoro group may also be employed. Alternatively, as substituents, an organic group which contains at least hydrogen and fluoro group may be employed as well. Polysilazane is formed by employing a polymer material having a bond of silicon (Si) and nitrogen (Ni) as a starting material.

Subsequently, a wire 613 which is connected to the impurity region 608 is formed to penetrate through the insulating layers 611 and 612, and the gate insulating film 604. The wire 613 can have either a single-layer structure or a stacked-layer structure. The wire 613 can be formed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), copper (Cu), and indium (In), or an alloy material which includes any of these elements as a main component. Other wires can be formed over the insulating layer 612 at the same time as the wire 613. The other wires correspond to a leading wire and the like.

A thin film transistor (TFT) 615 and a TFT group 616 can be formed in this manner. The TFT group corresponds to a group of TFTs which forms a circuit exhibiting a certain function, and can form an SRAM of the invention.

Figure 7A:
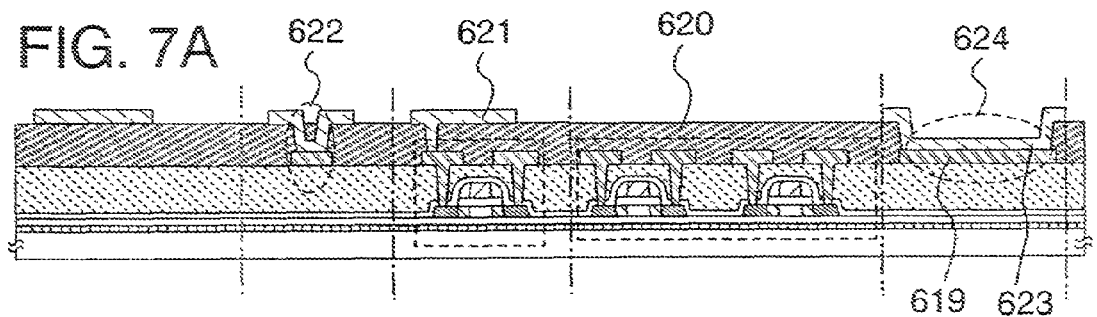
FIGS. 7A to 7C are diagrams showing a manufacturing process of a radio chip of the invention.

As shown in FIG. 7A, an insulating layer 620 is formed over the insulating layer 612. The insulating layer 620 can be formed by using an inorganic material or an organic material similarly to the insulating layers 611 and 612. A wire 621 is formed so as to penetrate through the insulating layer 620. The wire 621 can be formed similarly to the wire 613. The wire 621 is electrically connected to the wire 613 in a region 622 through an opening which is provided in the insulating layer 620. In the region 622, a common electrode of a memory element which is formed later can be grounded. In addition, a pad 623 is formed of the same layer as the wire 621. The pad 623 is electrically connected to a wire 619 in a region 624 through an opening which is provided in the insulating layer 620.

Figure 7B:
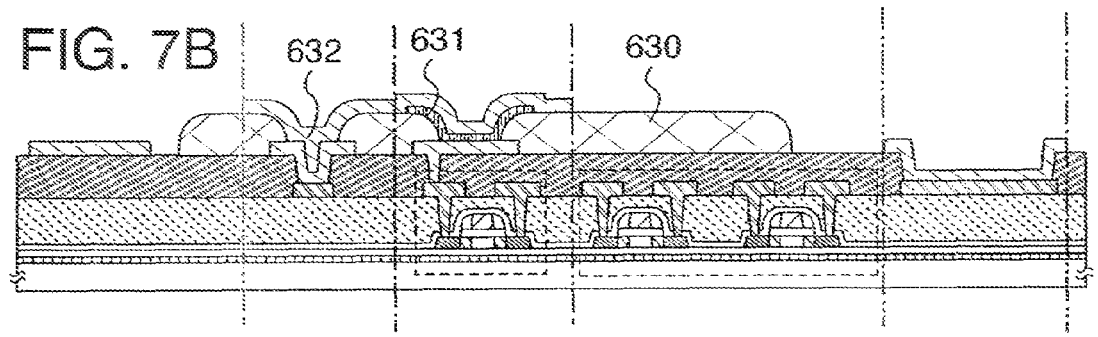

As shown in FIG. 7B, an insulating layer 630 is formed over the insulating layer 620. The insulating layer 630 can be formed by using an inorganic material or an organic material similarly to the insulating layers 611 and 612. The insulating layer 630 is provided with an opening. Sides of the opening of the insulating layer 630 are processed so as to be a tapered shape.

An organic compound layer 631 is formed in an opening which is provided over the thin film transistor (TFT) 615. The organic compound layer 631 can be formed by evaporation or sputtering. Such organic compound layer can be formed of a known electroluminescence material. Then, a wire 632 is formed so as to partially cover the organic compound layer 631 and the insulating layer 630. The wire 632 can be formed similarly to the wire 621. A region in which the wire 632 is formed corresponds to a memory region and a contact region. The wire 632 corresponds to a common electrode of the memory element. An organic memory which is formed in this manner can function as a ROM.

Figure 7C:
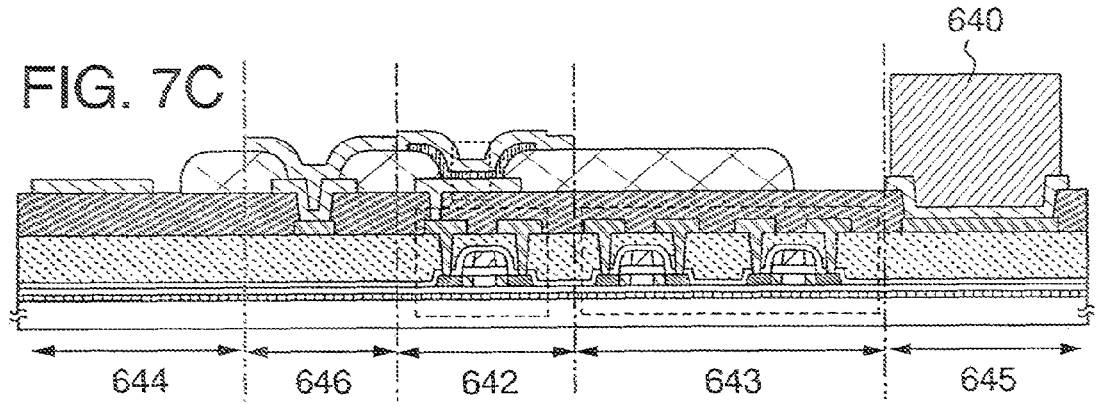

As shown in FIG. 7C, an antenna 640 is formed. At this time, thermo compression bonding is performed to the pad 623 such that the antenna 640 is electrically connected. A radio chip including a wire region 644 in which the leading wire and the like are formed, a ROM region 642 having the organic memory, an SRAM region 643 having the TFT group, a pad region 645, and a contact region 646 is formed in this manner. The pad region and the memory region are provided to be separated from each other to some extent. Accordingly, writing of data can be performed without being affected by stress at the time of performing the thermo compression bonding of the antenna.

In addition, the thermo compression bonding of the antenna may be performed in a condition where the flexibility of the insulating substrate 600 is low. Therefore, in this embodiment mode, description will be made of a mode where the radio chip is transposed onto a film substrate after the thermo compression bonding of the antenna.

Figure 8A:
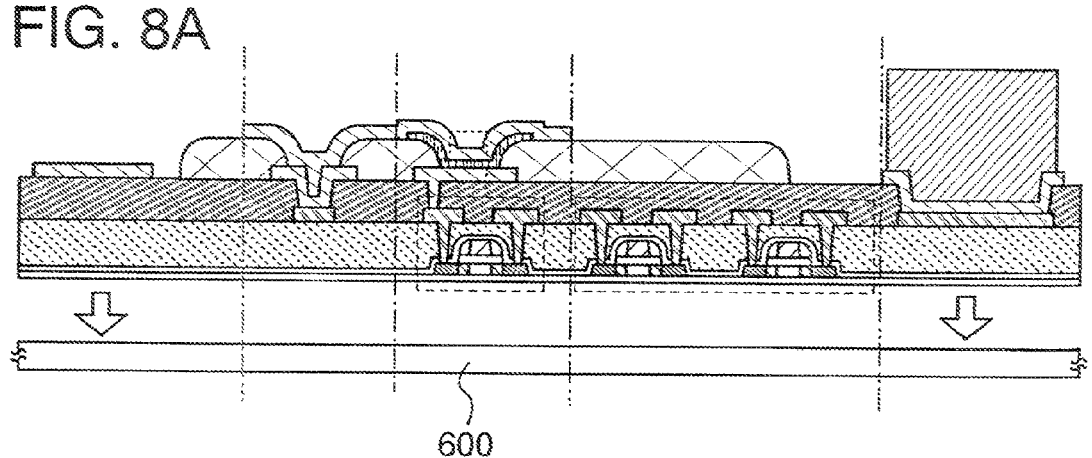
FIGS. 8A and 8B are diagrams showing a manufacturing process of a radio chip of the invention.

As shown in FIG. 8A, the insulating substrate 600 is separated by removing the release layer 601. The release layer 601 can be removed physically or chemically. For example, the crystalline structure of the release layer 601 can also be changed by performing heat treatment or the like to the semiconductor film 603. After that, an opening is provided so as to partially expose the release layer 601, and laser irradiation is performed to the exposed release layer 601. By performing laser irradiation to the release layer 601, a cue for separation can be provided. Then, the insulating substrate 600 can be separated physically from the thin film transistor and the like, and eventually, the thin film transistor and the like may naturally separate from the insulating substrate 600 by stress of the film without requiring applying additional power. Further, the release layer 601 can be removed when an opening which reaches to the release layer 601 is formed and etchant is injected through the opening, so that the release layer 601 can be removed by utilizing chemical reaction.

Figure 8B:
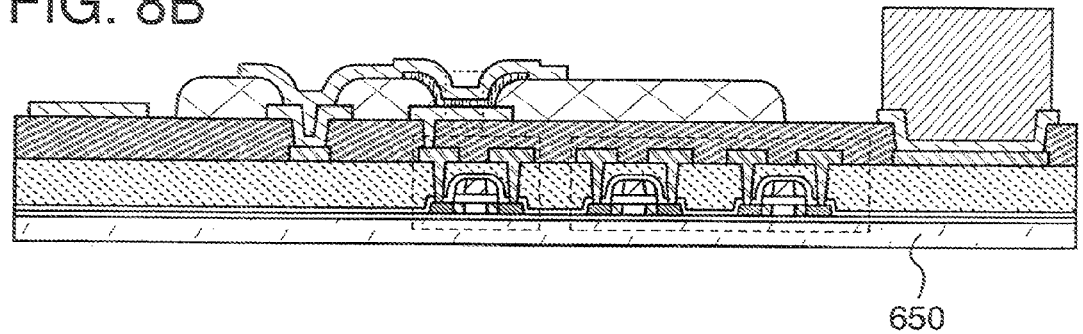

Then, as shown in FIG. 8B, a film substrate 650 is attached. When a surface of the film substrate 650 has an adhesive property, it can be attached as it is. When the surface of the film substrate 650 does not have the adhesive property, it can be attached with an adhesive agent.

Thus, a radio chip where the thin film transistor and the like are transposed onto the film substrate can be formed.

Embodiment Mode 5

In this embodiment mode, a shape of an antenna formed over a substrate for the antenna, which is applied to a radio chip having the memory element of the invention will be described.

As a transmission method of signals in the radio chip, electromagnetic coupling type or electromagnetic induction type (for example, 13.56 MHz) can be applied. In the case of employing the electromagnetic induction type, a conductive layer which functions as the antenna is formed to be circular (for example, a loop antenna) or spiral (for example, a spiral antenna) since electromagnetic induction with change of magnetic field density is utilized.

In the case of applying micro-wave type (for example, UHF zone (860 to 960 MHz), 2.45 GHz, or the like) as the transmission method of the signals in the radio chip, a shape of length or the like of the conductive layer functioning as the antenna is determined considering wavelength of electromagnetic wave which is employed for transmission of the signals. For example, the conductive layer which functions as the antenna can be formed to be a linear shape (for example, a dipole antenna), a flat shape (for example, a patch antenna), a ribbon-shape, or the like. In addition, the shape of the conductive layer which functions as the antenna is not limited to the linear shape; it may be provided to be a wave shape, a snake-shape, or a shape which combines them considering the wavelength of the electromagnetic wave.

Figure 9A:
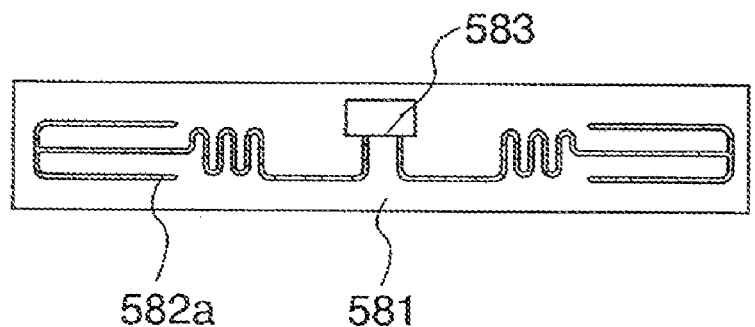
FIGS. 9A to 9C are diagrams showing shapes of an antenna of a radio chip on which an SRAM of the invention can be mounted.

FIG. 9A shows an example where the conductive layer which functions as the antenna is formed to be a narrow linear, and rectangular shape. In FIG. 9A, an integrated circuit 583 having the memory region and the like is attached to a substrate for an antenna 581 over which a conductive layer (a dipole antenna) 582a which functions as an antenna is formed.

Figure 9B:
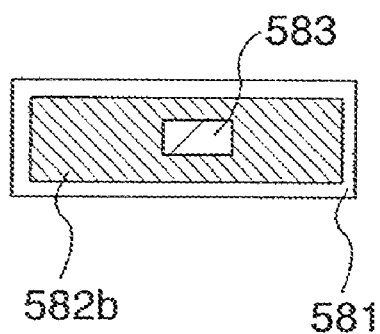

FIG. 9B shows an example where the conductive layer which functions as the antenna is formed to be a wide linear shape. In FIG. 9B, the integrated circuit 583 having the memory region and the like is attached to the substrate for the antenna 581 over which a conductive layer (a patch antenna) 582b which functions as an antenna is formed.

Figure 9C:
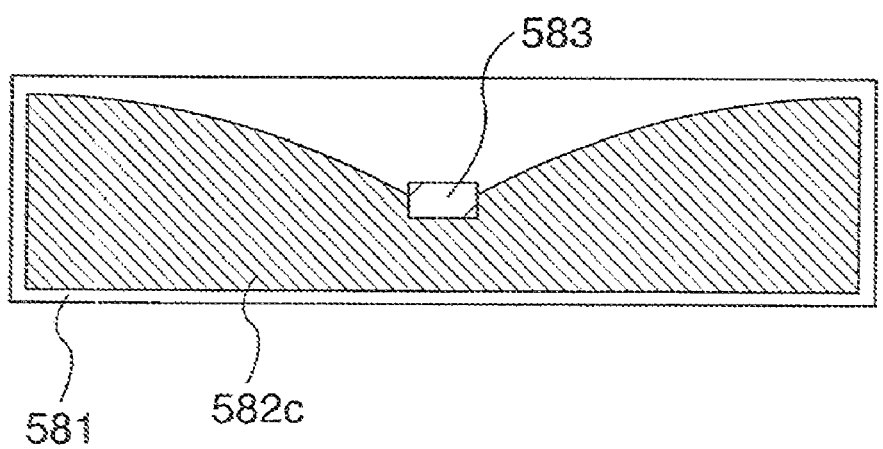

FIG. 9C shows an example where the conductive layer which functions as the antenna is formed to be a ribbon-shape (also described as flabellate). In FIG. 9C, the integrated circuit 583 having the memory region and the like is attached to the substrate for the antenna 581 over which a conductive layer 582c which functions as an antenna is formed.

The conductive layer which functions as the antenna is formed of a conductive material over the substrate for the antenna by using CVD, sputtering, a printing method such as a screen printing method or a gravure printing method, a droplet discharge method, a dispenser method, a plating method, or the like. The conductive material is an element selected from aluminum (Al), titanium (Ti), silver (Ag), copper (Cu), gold (Au), platinum (Pt), nickel (Ni), palladium (Pd), tantalum (Ta), molybdenum (Mo), and indium (In), an alloy material which includes any of these elements as a main component, or a compound material which includes any of these elements as a main component, and a single-layer structure or a stacked-layer structure is formed.

For example, in the case of forming the conductive layer which functions as the antenna by using the screen printing method, it can be provided by selectively printing a conductive paste where a conductive particle having a particle size of several nm to several ten μm is dissolved or dispersed in an organic resin. As the conductive particle, metal particles of one or more from any of silver (Ag), gold (Au), copper (Cu), nickel (Ni), platinum (Pt), palladium (Pd), tantalum (Ta), molybdenum (Mo), titanium (Ti), and the like, a fine particle of silver halide, or a dispersing nano particle can be employed. In addition, as the organic resin included in the conductive paste, one or a plurality of organic resins which are selected from organic resins functioning as a binder, a solvent, a dispersing agent, and a coating member of the metal particles can be used. Typically, an epoxy resin and a silicon resin can be given as examples of any the organic resin. Further, for forming the conductive layer, burning is preferably performed after the conductive paste. For example, in the case of employing a fine particle which includes silver as a main component (for example, the particle size is 1 nm or more and 100 nm or less) as a material for the conductive paste, the conductive layer can be obtained by burning it within a temperature range of 150 to 300° C. to cure. Further, a fine particle which includes solder or lead-free solder as a main component may be employed as well; in that case, a fine particle having a particle size of 20 μm or less is preferably employed. Solder or lead-free solder has an advantage such as a low cost.

As well as the aforementioned materials, ceramic, ferrite, or the like may be applied to the antenna.

In addition, when the electromagnetic coupling type or the electromagnetic induction type is applied and a radio chip having the antenna is provided to be in contact with metal, a magnetic material having magnetic permeability is preferable provided between the semiconductor device and the metal. This is because eddy-current flows to the metal as change of the magnetic filed, and the communication range is decreased since the changes of the magnetic field is weakened by demagnetizing field which is generated by the eddy-current. Therefore, by providing the material having the magnetic permeability between the radio chip and the metal, the eddy-current of the metal can be suppressed, and decrease of the communication range can be suppressed. Note that ferrite having high magnetic permeability and low high-frequency loss or a metal thin film can be employed as the magnetic material.

A radio chip to which an antenna formed over the substrate for the antenna is adhered can be provided in this manner.

Embodiment 1

In this embodiment, Description will be made of a mode where a radio chip having a memory element of the invention is formed over a plastic substrate. Note that the radio chip of this embodiment includes an RF circuit for performing radio communication and a CPU as an operating circuit.

Table 1 is communication specifications of the radio chip of the invention.

TABLE 1

| | | ISO | ISO/IEC 15693 (Part compliance) |
|---|---|---|---|
| Reader/Writer | | Frequency | 13.56 MHz |
| | | Modulation | Amplitude shift keying |
| | | Modulation index | 100% |
| | | Data transfer rate | 26.48 kbits/s |
| | | Data encoding | Pulse-position modulation |
| | | Data encoding mode | One out of four |
| Radio chip | | communication signal interface | Load modulation |

TABLE 1-continued

| ISO | ISO/IEC 15693 (Part compliance) |
|---|---|
| subcarrier frequency | 423.75 KHz |
| Data transfer rate | 26.48 kbits/s |
| Data encoding | Manchester system |

Radio signals of 13.56 MHz are used for communication, and communications standard or protocol is partially based on ISO/IEC 15693. The radio chip of the invention supplies power supply voltage from the radio signals through an antenna. The radio chip of the invention has an external antenna; however, it may have a built-in antenna which is formed together with the circuit. Transfer speed of data is set to 26.48 kbit/s, data encoding from a reader/writer to the radio chip is set to pulse-position modulation, and data encoding from the radio chip to the reader/writer is set to Manchester method.

Table 2 is brief description of the radio chip of the invention.

TABLE 2

| | | Total TFTs | 71K |
|---|---|---|---|
| | | Size* | 20 mm × 20 mm × 195 μm (Core: 14 mm × 14 mm × 195 μm) |
| | | Weight* | 103 mg |
| Logic circuit | CPU | Frequency | 3.39 MHz |
| | | Total TFTs | 26K |
| | | Architecture | 8 b CISC |
| | | General register | 16 × 8 b |
| | | Address bus | 16 b |
| | | Data bus | 8 b |
| | ROM | Size | 2 KB |
| | RAM | Size | 64 B |
| | Controller | Tr count | 11K |
| | | Circuit configuration | CPU interface, RF interface, Register, Clock control circuit |
| RF circuit | | Circuit configuration | Resonance capacitor, Power circuit, System reset circuit, Clock generation circuit, Demodulation circuit, Modulation circuit |

*Antenna is not included.

Since the radio chip of the invention can be formed over a flexible substrate by using thin film transistors as described above, a very lightweight radio chip which is 103 mg can be provided.

Figure 10:
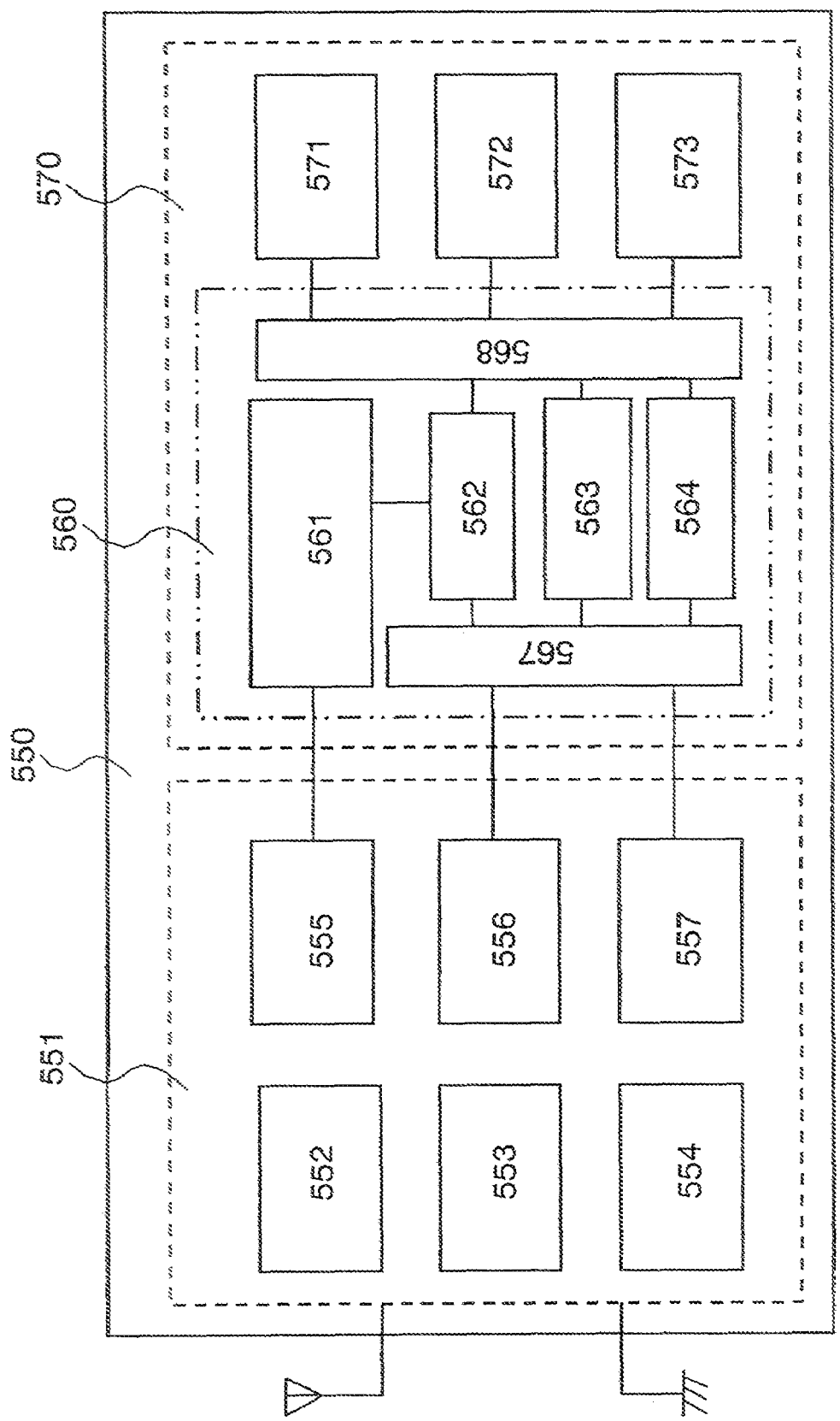
FIG. 10 is a block diagram showing a CPU in which an SRAM of the invention can be mounted.

Next, FIG. 10 shows a block configuration of the radio chip of the invention. A radio chip 550 of the invention includes a radio circuit 551 and a logic circuit 570. The radio circuit 551 includes a resonant capacitor 552, a power supply circuit 553, a system reset circuit 554, a clock generator 555, a demodulating circuit 556, a modulating circuit 557, and the like. The resonant capacitor 552 and the external antenna can form a resonant circuit. The power supply circuit 553 includes a rectifying circuit and a storage capacitor, and can generate power supply voltage. The system reset circuit 554 can generate system reset signals and the clock generator 555 can generate system clock signals. The demodulating circuit 556 includes an LPF (Low Pass Filter) and can extract data from the radio signals. The modulating circuit 557 can superpose data to the radio signals by Manchester method. These circuits can be formed using thin film transistors.

The logic circuit 570 includes a controller 560, a CPU 571, a ROM 572, a RAM 573, and the like. The controller 560 includes a clock control circuit 561, a control register 562, a receive data register 563, a send data register 564, a radio interface 567, and a CPU interface 568. The memory cell of the invention can be applied to the RAM 573. These circuits can be formed using thin film transistors. The demodulating circuit 556 and the modulating circuit 557 can exchange signals with the control register 562, the receive data register 563, and the send data register 564 through the radio interface 567. The clock generator 555 is controlled by the clock control circuit 561, and the clock control circuit 561 operates based on the control register 562. The control register 562, the receive data register 563, and the send data register 564 can exchange signals with the CPU 571, the ROM 571, and the RAM 573 through the CPU interface 568.

A CPU included in the radio chip is 8-bit CISC and can be formed with a flip-flop which is operated using a two-phase non-overlap clock. By forming with the flip-flop which is operated using a two-phase non-overlap clock, variation in clock skew or a malfunction caused by characteristic variation in TFTs can be prevented so that reliability can be improved. A mask ROM of 2 KB can be applied to the ROM 572 so that programs, private keys, and the like can be stored therein. The memory cell of the invention can be employed as the RAM 573. For example, an SRAM cell of the invention having capacitance of 64 B can be applied, and the memory cell can be used as a working region of the CPU. The circuit configuration of the memory cell is devised in this manner in order to improve reliability of writing/reading. In addition, the controller 560 has a function of a state machine of the radio chip.

The radio chip can employ SAFER (Secure And Fast Encryption Routine) as an algorithm for code processing. SAFER is mainly formed with 8-bit operation and is an algorithm suitable for an 8-bit CPU. The radio chip can be mounted with a function where a cryptogram is decoded by using a private key after the cryptogram is received and a plaintext is sent. Needless to say, other algorithms for code processing such as DES or AES can be employed to the radio chip.

Figure 11:
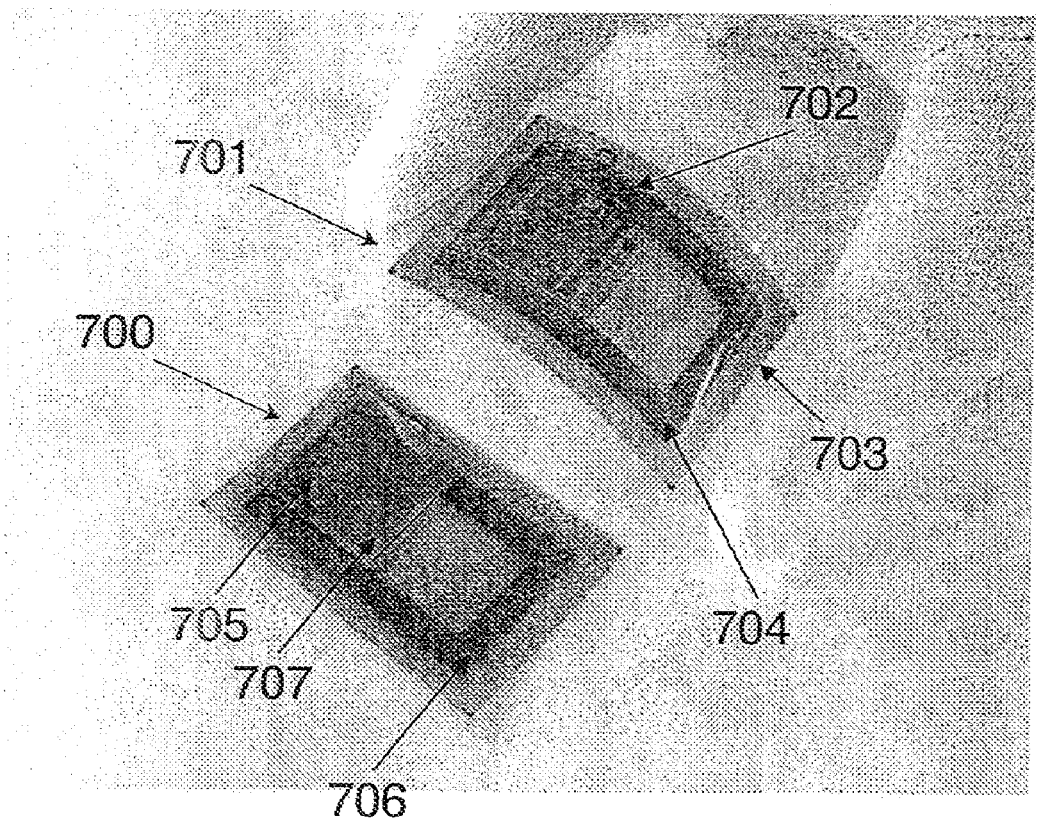
FIG. 11 is a photograph of radio chips on which an SRAM of the invention can be mounted.

FIG. 11 is a photograph of a radio chip 700 which is formed over a glass substrate and a radio chip 701 which is formed over a flexible substrate. The radio chip of the invention can be a very thin one like this.

The wireless chip 700 has an integrated circuit 705, an antenna 706, and a glass substrate 707. The wireless chip 701 has an integrated circuit 702, a film substrate 703, and an antenna 704. The integrated circuit 705 is provided over the glass substrate 707. The integrated circuit 702 and the antenna 704 are provided over the film substrate 703.

Figure 12:
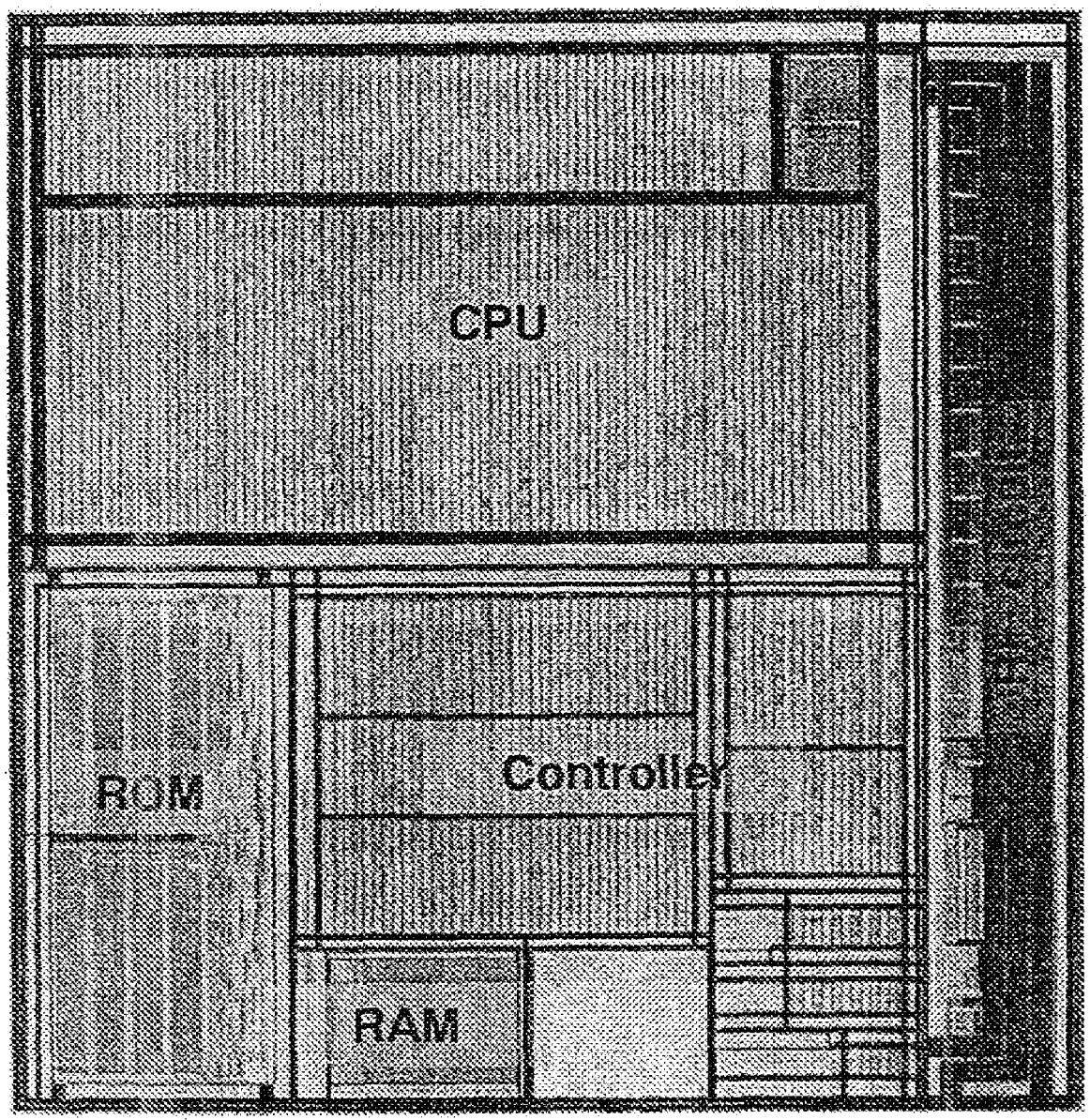
FIG. 12 is a block diagram of a radio chip on which an SRAM of the invention can be mounted.

In addition, FIG. 12 is a macro photograph of the radio chip with a block diagram. In FIG. 12, the configuration of the memory cell of the invention can be applied to a region of a RAM.

The present application is based on Japanese Priority application No. 2005-341104 filed on Nov. 25, 2005 with the Japanese Patent Office, the entire contents of which are hereby incorporated by reference.

What is claimed is:

1. A semiconductor memory device comprising a memory cell array having a plurality of memory cells, wherein each of the plurality of memory cells comprises:
   an analog switch;
   a first inverter;
   a second inverter; and
   a clocked inverter, and
   wherein:

a first terminal of the analog switch is electrically connected to a first data line, a second terminal of the analog switch is directly electrically connected to an input terminal of the first inverter, an output terminal of the second inverter, and an input terminal of the clocked inverter, an output terminal of the first inverter is electrically connected to an input terminal of the second inverter, an output terminal of the clocked inverter is electrically connected to a second data line, each of the analog switch and the clocked inverter is electrically connected to at least one word line, the word line electrically connected to the analog switch is different from the word line electrically connected to the clocked inverter, the analog switch includes a first transistor and a second transistor, the first terminal of the analog switch is electrically connected to one of a source and a drain of the first transistor and one of a source and a drain of the second transistor, and the second terminal of the analog switch is electrically connected to the other of the source and the drain of the first transistor and the other of the source and the drain of the second transistor.

2. The semiconductor memory device according to claim 1, wherein each of the first transistor and the second transistor is a thin film transistor.

3. The semiconductor memory device according to claim 1, wherein each of the first inverter and the second inverter includes an N-channel transistor and a P-channel transistor.

4. The semiconductor memory device according to claim 1, wherein each of the first inverter and the second inverter includes an N-channel transistor and a P-channel transistor, and wherein each of the N-channel transistor and the P-channel transistor is a thin film transistor.

5. The semiconductor memory device according to claim 1, wherein the clocked inverter includes an N-channel transistor and a P-channel transistor.

6. The semiconductor memory device according to claim 1, wherein the clocked inverter includes an N-channel transistor and a P-channel transistor, and wherein each of the N-channel transistor and the P-channel transistor is a thin film transistor.

7. The semiconductor memory device according to claim 1, further comprising a flexible substrate, wherein the analog switch, the first inverter, the second inverter, and the clocked inverter are provided over the flexible substrate.

8. A radio chip using the semiconductor memory device according to claim 1.

9. A semiconductor memory device comprising a memory cell array having a plurality of memory cells, wherein each of the plurality of memory cells comprises:
an analog switch;
a first inverter;
a second inverter; and
a clocked inverter, and
wherein:
a first terminal of the analog switch is electrically connected to a first data line,
a second terminal of the analog switch is directly electrically connected to an input terminal of the first inverter, an output terminal of the second inverter, and an input terminal of the clocked inverter,
an output terminal of the clocked inverter is electrically connected to a second data line,
a gate of a first transistor included in the analog switch is electrically connected to a first word line,
a gate of a second transistor included in the analog switch is electrically connected to a second word line,
a gate of a third transistor included in the clocked inverter is electrically connected to a third word line,
a gate of a fourth transistor included in the clocked inverter is electrically connected to a fourth word line,
the first terminal of the analog switch is electrically connected to one of a source and a drain of the first transistor and one of a source and a drain of the second transistor, and
the second terminal of the analog switch is electrically connected to the other of the source and the drain of the first transistor and the other of the source and the drain of the second transistor.

10. The semiconductor memory device according to claim 9, wherein each of the first transistor and the second transistor is a thin film transistor.

11. The semiconductor memory device according to claim 9, wherein each of the first inverter and the second inverter includes an N-channel transistor and a P-channel transistor.

12. The semiconductor memory device according to claim 9, wherein each of the first inverter and the second inverter includes an N-channel transistor and a P-channel transistor, and wherein each of the N-channel transistor and the P-channel transistor is a thin film transistor.

13. The semiconductor memory device according to claim 9, wherein the clocked inverter includes an N-channel transistor and a P-channel transistor.

14. The semiconductor memory device according to claim 9, wherein the clocked inverter includes an N-channel transistor and a P-channel transistor, and wherein each of the N-channel transistor and the P-channel transistor is a thin film transistor.

15. The semiconductor memory device according to claim 9, further comprising a flexible substrate, wherein the analog switch, the first inverter, the second inverter, and the clocked inverter are provided over the flexible substrate.

16. A radio chip using the semiconductor memory device according to claim 9.

17. An operating method of a semiconductor memory device comprising a memory cell array having a plurality of memory cells, wherein each of the plurality of memory cells comprises:
an analog switch;
a first inverter;
a second inverter; and
a clocked inverter, and
wherein:
a first terminal of the analog switch is electrically connected to a first data line,
a second terminal of the analog switch is directly electrically connected to an input terminal of the first inverter, an output terminal of the second inverter, and an input terminal of the clocked inverter,
an output terminal of the first inverter is electrically connected to an input terminal of the second inverter,
an output terminal of the clocked inverter is electrically connected to a second data line,
each of the analog switch and the clocked inverter is electrically connected to at least one word line,
the word line electrically connected to the analog switch is different from the word line electrically connected to the clocked inverter,
the analog switch includes a first transistor and a second transistor, the first terminal of the analog switch is electrically connected to one of a source and a drain of the first transistor and one of a source and a drain of the second transistor, the second terminal of the analog switch is electrically connected to the other of the source and the drain of the first transistor and the other of the source and the drain of the second transistor, and a memory cell includes the first inverter, the second inverter, and the clocked inverter; the method comprising:

turning on the analog switch, turning off the clocked inverter, and writing data to the memory cell, and turning off the analog switch, turning on the clocked inverter, and reading the data from the memory cell.

18. An operating method of a semiconductor memory device comprising a memory cell array having a plurality of memory cells, wherein each of the plurality of memory cells comprises:

an analog switch;
a first inverter;
a second inverter; and
a clocked inverter, and
wherein:

a first terminal of the analog switch is electrically connected to a first data line, a second terminal of the analog switch is directly electrically connected to an input terminal of the first inverter, an output terminal of the second inverter, and an input terminal of the clocked inverter, an output terminal of the clocked inverter is electrically connected to a second data line, a gate of a first transistor included in the analog switch is electrically connected to a first word line, a gate of a second transistor included in the analog switch is electrically connected to a second word line, a gate of a third transistor included in the clocked inverter is electrically connected to a third word line, a gate of a fourth transistor included in the clocked inverter is electrically connected to a fourth word line, the first terminal of the analog switch is electrically connected to one of a source and a drain of the first transistor and one of a source and a drain of the second transistor, and the second terminal of the analog switch is electrically connected to the other of the source and the drain of the first transistor and the other of the source and the drain of the second transistor, a memory cell includes the first inverter, the second inverter, and the clocked inverter; the method comprising:

turning on the analog switch, turning off the clocked inverter, and writing data to the memory cell, and turning off the analog switch, turning on the clocked inverter, and reading the data from the memory cell.

* * * * *